United States Patent [19]

Boyd et al.

[11] Patent Number: 5,726,084
[45] Date of Patent: Mar. 10, 1998

[54] METHOD FOR FORMING INTEGRATED CIRCUIT STRUCTURE

[75] Inventors: John M. Boyd, Woodlawn; Joseph P. Ellul; Sing P. Tay, both of Nepean, all of Canada

[73] Assignee: Northern Telecom Limited, Montreal, Canada

[21] Appl. No.: 637,963

[22] Filed: Apr. 25, 1996

Related U.S. Application Data

[60] Division of Ser. No. 289,365, Aug. 11, 1994, abandoned, which is a continuation-in-part of Ser. No. 80,544, Jun. 24, 1993, Pat. No. 5,362,669.

[51] Int. Cl.$^6$ .................................................. H01L 21/8242
[52] U.S. Cl. ........................... 438/239; 438/197; 438/238; 438/294; 438/296
[58] Field of Search ..................... 148/DIG. 14, DIG. 50; 438/197, 238, 239, 294, 296, 183, 184, 200, 201, 207, 227, 429, 430, 222

[56] References Cited

U.S. PATENT DOCUMENTS

| | | | |
|---|---|---|---|
| 3,484,311 | 12/1969 | Benzing | 437/62 |
| 3,578,515 | 5/1971 | Borrello et al. | 437/62 |
| 3,579,058 | 5/1971 | Armgarth | 437/62 |
| 4,758,531 | 7/1988 | Beyer et al. | 437/67 |
| 4,839,309 | 6/1989 | Easter et al. | 437/62 |
| 4,886,762 | 12/1989 | Boland et al. | 437/74 |
| 5,275,974 | 1/1994 | Ellul et al. | 437/203 |
| 5,298,450 | 3/1994 | Verret | 437/67 |
| 5,302,541 | 4/1994 | Akazawa | 437/52 |
| 5,316,978 | 5/1994 | Boyd et al. | 437/203 |
| 5,352,923 | 10/1994 | Boyd et al. | 257/536 |
| 5,362,669 | 11/1994 | Boyd et al. | 437/67 |
| 5,394,000 | 2/1995 | Ellul et al. | 257/301 |
| 5,407,846 | 4/1995 | Chan | 437/41 |
| 5,411,913 | 5/1995 | Bashir et al. | 437/67 |
| 5,477,071 | 12/1995 | Hamamoto et al. | 257/302 |
| 5,508,531 | 4/1996 | Ha | 257/57 |

FOREIGN PATENT DOCUMENTS

| | | | |
|---|---|---|---|
| 0023217 | 2/1982 | Japan | 437/62 |
| 0168233 | 10/1983 | Japan | 437/67 |
| 0220443 | 12/1983 | Japan | 437/67 |
| 0014677 | 1/1984 | Japan | 437/40 |
| 0232440 | 12/1984 | Japan | 437/67 |
| 0154638 | 8/1985 | Japan | 437/67 |
| 0281537 | 12/1986 | Japan | 437/67 |
| 362040740 | 2/1987 | Japan | 437/67 |
| 0093954 | 4/1987 | Japan | 437/62 |
| 362125629 | 6/1987 | Japan | 437/67 |
| 0292664 | 11/1988 | Japan | 437/918 |
| 0020635 | 1/1989 | Japan | 437/67 |
| 0144648 | 6/1989 | Japan | 437/918 |
| 0151061 | 6/1990 | Japan | 437/918 |
| 404144123 | 5/1992 | Japan | 437/40 |

*Primary Examiner*—John Niebling
*Assistant Examiner*—Long Pham
*Attorney, Agent, or Firm*—Angela C. de Wilton

[57] ABSTRACT

A integrated circuit structure and a method of fabrication thereof are provided. In particular, fully planarized, trench isolated semiconductor regions, e.g. comprising doped polysilicon, are provided in an integrated circuit substrate. These polysilicon regions have a smooth surface, substantially coplanar with the substrate surface, provided by chemical mechanical polishing. The near zero topography substrate provides for formation thereon of integrated circuit structures including e.g. capacitors, resistors, thin film capacitors, and interconnects, in the polysilicon trench regions at the same process level as devices formed in the semiconductor substrate. Thus a simple and flexible process for formation of improved device structures is provided, compatible with known Bipolar, CMOS and Bipolar-CMOS processes.

9 Claims, 7 Drawing Sheets

1

METHOD FOR FORMING INTEGRATED CIRCUIT STRUCTURE

This application is a division of application Ser. No. 08/289,365 filed Aug. 11, 1994 by J. M. Boyd, et al. for "Integrated Circuit Structure and Method of Fabrication Thereof", now abandoned, which was a Continuation-In-Part of application Ser. No. 08/080,544, filed Jun. 24, 1993, in the name of J. M. Boyd, et al. and entitled "Method of Making Integrated Circuits" now U.S. Pat. No. 5,362,669.

FIELD OF THE INVENTION

This invention relates to an integrated circuit structure and a method of fabrication of an integrated circuit structure.

BACKGROUND OF THE INVENTION

In conventional integrated circuit technology, it is known to provide a layer of polysilicon on top of a thick field oxide as a substrate for building electrical components such as inter-polysilicon capacitors, resistors, and thin film transistors.

For example, a typical, known structure for a flat plate inter-polysilicon capacitor comprises a first layer of polysilicon forming a bottom electrode, a layer of capacitor dielectric and a second layer of polysilicon forming a top electrode. The capacitor structure is formed on a region of a thick field isolation oxide, to reduce parasitic capacitance effects to the substrate. Such a capacitor is effectively linear over a wide range of applied bias voltage and frequency, and has applications in a variety of analog electrical circuits such as operational amplifiers and filters.

A conventional known method of forming a capacitor structure as described above, comprises: depositing and doping a layer of polysilicon on a region of a field isolation layer; patterning the polysilicon layer to define a bottom electrode; forming thereon a capacitor dielectric layer, either by oxidation of the polysilicon or by deposition of an oxide or other suitable dielectric material; and then depositing, doping and patterning a second polysilicon layer to form the top electrode overlying the dielectric.

In a CMOS (complementary metal oxide semiconductor) or bipolar-CMOS (BiCMOS) integrated circuit process, parts of the same polysilicon layers which are used to form capacitor electrodes may be used to form elements of other devices structures. For example, polysilicon gate electrodes of transistors may be formed using either the first or second polysilicon layer used in forming the capacitor electrodes. Concurrent formation of gate electrodes and capacitor electrodes, and other structures, from parts of the same polysilicon layer reduces the number of masking steps and thus decreases process complexity.

Nevertheless, there are drawbacks to forming electrical devices on top of the field oxide. The flexibility of the processing sequence is limited by the steps required for forming the polysilicon layers. Furthermore, the additional thicknesses of the polysilicon layers, and other materials required to form these devices on top of the field oxide, adds significantly to the surface topography. A non-planar surface topography exacerbates problems in subsequent lithographic steps for formation of contacts and interconnects, particularly as device dimensions are reduced into the deep submicron range, i.e. ≦0.5 µm.

In one known method of reducing the contact depth differential between first and second electrodes of conventional capacitor structures as described above, it is known to form a "tab" contact to the top electrode of the polysilicon capacitor, i.e. the top electrode is extended down alongside of the bottom electrode to form an extension, or tab, isolated from the bottom electrode by part of the capacitor dielectric which also extends around the side of the bottom electrode. A contact to the top electrode is provided on the tab. However, this structure is more susceptible to breakdown, which may occur at the top edge of the bottom electrode, due to oxide thinning and/or high electric fields over the edge of the electrode.

Furthermore, the surface of a polycrystalline silicon may be rough (as a result of its grain structure), depending on the deposition technique, composition of the deposited material and impurities, and subsequent thermal anneals. Surface roughness leads to imperfections in interpolysilicon dielectrics grown or deposited on a the polysilicon surface. Surface roughness and associated defects may contribute to low-voltage dielectric leakage and/or low breakdown voltage. These effects become more significant for thinner inter-polysilicon dielectrics, e.g. below 30 nm.

Residual traces of polysilicon (stringers) may be left along edges of steps after etching. Stringers may be formed during the top electrode etch if the bottom electrode is patterned prior to dielectric formation. For this reason, some known process flows, call for dielectric formation before patterning of either of the polycrystalline silicon layers. This sequence reduces the risk of stringer formation, but complicates process integration schemes, especially if there are other process options, e.g. a resistor, being formed from the same polysilicon layers.

Thus alternative methods of forming capacitor structures and other device structures are sought to alleviate these problems.

SUMMARY OF THE INVENTION

The present invention seeks to provide an integrated circuit structure and a method of fabrication of an integrated circuit structure, which avoid or reduce the above-mentioned problems.

According to one aspect of the present invention there is provided an integrated circuit structure comprising: a semiconductor substrate having a planar surface and a plurality of trench regions defined therein filled with a layer of semiconductor material; the surface of the semiconductor material being fully planarized to provide trench regions of semiconductor material having a smooth surface substantially coplanar with a surface of the substrate; and, semiconductor devices formed in the coplanar surfaces of both the substrate and the semiconductor material in trench regions.

Thus an integrated circuit substrate is provided with fully planarized semiconductor regions, e.g. comprising polysilicon, defined in the substrate surface. These semiconductor regions have surfaces coplanar with the surface of the semiconductor substrate. Thus, device structures may be defined in both the isolated semiconductor regions and the substrate at the same process level. If required, the trench semiconductor regions may be isolated from the substrate by a layer of dielectric lining the trench. For example, individual trench isolated semiconductor regions may be individually selectively doped, to form elements of various options, i.e. devices structures including capacitors, resistors, thin film transistors. Other devices are formed in a conventional manner in the surrounding semiconductor substrate surface at the same process level, preferably by concurrent process steps.

For example, where the substrate region is used to form a bottom electrode of a capacitor, the fully planarized surface of the semiconductor region is heavily doped to form the conductive bottom electrode. The surface is preferably planarized by chemical mechanical polishing (CMP) and provides a smooth substrate surface for formation thereon of a thin capacitor dielectric. The smooth surface is beneficial in reducing defect formation in surface oxides and other dielectrics, which increases the breakdown strength of the dielectric. Furthermore, the reduced topography allows for reduced contact depth differentials, and preferably allows for coplanar contacts.

Advantageously, when the semiconductor trench region is heavily doped to form part of a device structure, e.g. a bottom electrode of a capacitor, the latter is fabricated at a relatively early stage in the process, when thermal budget constraints are not so stringent, i.e. before formation of shallow junctions, or before other process steps where thermal effects, e.g. unwanted diffusion, must be minimized.

According to another aspect of the present invention there is provided a method of forming an integrated circuit structure comprising: providing an integrated circuit substrate having a planar surface and a plurality of steep-sided trenches defined therein; filling the trenches with at least one trench filling layer comprising a semiconductor material; planarizing the substrate surface by a step of chemical mechanical polishing to remove parts of the at least one trench filling layer extending above a surface of the substrate, thereby forming a plurality of trench regions filled with semiconductor material and each having a fully planarized surface substantially coplanar with the substrate surface; and then forming semiconductor devices in the semiconductor substrate and in the semiconductor filled trench regions.

Advantageously, a plurality of polysilicon regions with a smooth surface, substantially coplanar with the substrate surface, are provided by chemical mechanical polishing. The resulting near zero topography substrate provides for formation of integrated circuit structures including capacitors, resistors, thin film capacitors, interconnects, etc., at the same process level as devices formed in the substrate. Thus a simple and flexible process for formation of improved device structures is provided, compatible with known Bipolar, CMOS and Bipolar-CMOS processes.

For example, after providing a substrate with a plurality of planarized semiconductor regions defined therein, devices are defined in the both the isolated semiconductor regions, and in the surrounding substrate. Many options may be processed concurrently using a common semiconductor layer to form elements of more than one type of device. For example, after heavily doping a semiconductor region to form a bottom electrode of a capacitor, a subsequent polysilicon layer may be provided to form a top electrode of the capacitor, and also other structures, e.g. gate electrodes of transistors formed in the surrounding Substrate. Thus the number of masking steps can be reduced, and the flexibility of the process is increased, while reducing complexity of process flow for bipolar, CMOS or bipolar-CMOS integrated circuits.

Thus, there is provided an integrated circuit structure and a method of fabrication of an integrated circuit, in which the above mentioned problems are avoided or reduced.

BRIEF DESCRIPTION OF THE DRAWINGS

Embodiments of the invention will now be described by way of example, with reference to the accompanying drawings, in which.

DESCRIPTION OF THE PREFERRED EMBODIMENTS

Figure 1:
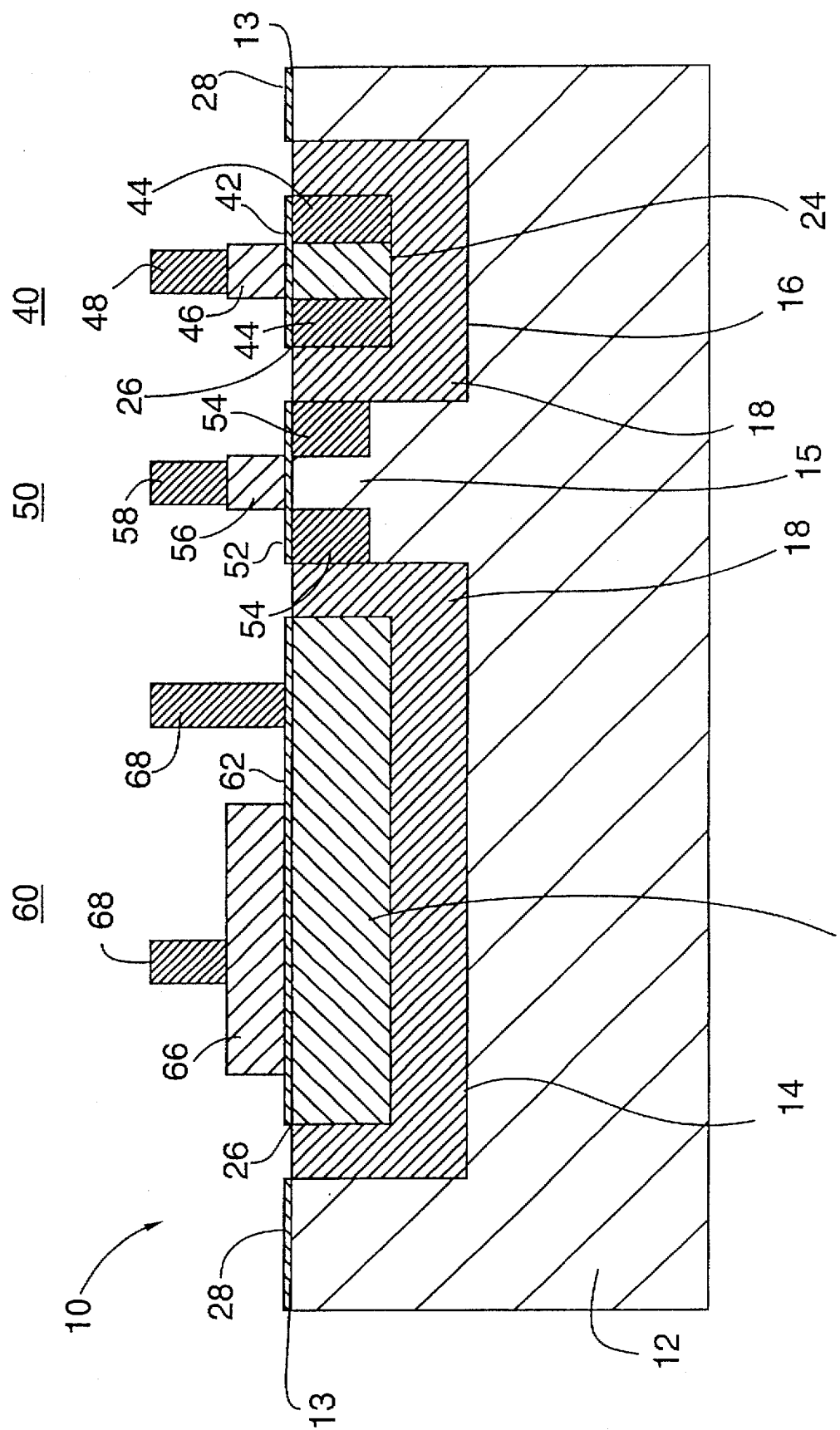
FIG. 1 shows a schematic cross-sectional view through part of an integrated circuit structure according to a first embodiment of the present invention.

Part of an integrated circuit structure 10 according to the first embodiment of the present invention is shown schematically in FIG. 1. An integrated circuit substrate is provided in the form of a conventional silicon semiconductor wafer 12 having formed therein steep-sided trenches 14 and 16. Trenches 14 and 16 are lined with a layer of a dielectric material 18, e.g. a conformal layer of deposited silicon dioxide. Each trench 14 and 16 is filled with a layer of semiconductor material forming trench isolated semiconductor regions 22 and 24 in the trenches 14 and 16 respectively. The semiconductor material is for example, polysilicon, which is selectively doped as will be described below.

Each of the layers filling the trenches 14 and 16, (i.e. dielectric layer 18 and semiconductor layers 22 and 24) are fully planarized, preferably by chemical mechanical polishing, so that surfaces 26 of these regions are substantially coplanar with the surrounding surface 13 of the substrate 12. Thus the resulting substrate comprises trench regions of semiconductor material having a smooth surface, coplanar with the surrounding surfaces of the substrate wafer and isolated from the substrate by the layer of dielectric lining the trench. Semiconductor devices comprising a capacitor 60 and thin film transistor 40 are formed in the semiconductor regions 22 and 24 in the trenches 14 and 16, respectively. A conventional MOSFET 50 is formed in the substrate region 15 between the trenches 14 and 16.

The MOSFET 50 is formed in region 15 of the substrate in a conventional manner and comprises heavily doped regions 54 forming the source and drain regions, a gate dielectric 52, e.g. a thin layer of silicon dioxide, and a gate electrode 56, e.g. heavily doped polysilicon.

The capacitor 60 is a flat plate capacitor comprising a bottom electrode formed by region 22, which is heavily doped to provide a conductive layer. A layer 62 of dielectric is provided to form a capacitor dielectric on the smooth surface of the polysilicon electrode 22. Another layer of doped polysilicon is provided thereon to form the top electrode 66 of the capacitor.

The thin film transistor 40 in trench region 16 comprises selectively doped regions 44 in the semiconductor region 24 forming the source and drain of the thin film transistor, with part of the region 24 in between forming the channel. A layer 42 of dielectric is provided thereon to form a gate dielectric, and an overlying conductive gate electrode 46 of the transistor 40 is provided by a second polysilicon layer.

Because the substrate provides polysilicon regions 22 and 24 with surfaces coplanar with the substrate, it will be apparent that certain elements of the devices, i.e. the capacitor 60 and the thin film transistor 40 may be formed simultaneously with formation of the MOSFET in the substrate surface. e.g. the source and drain regions of the MOSFET and thin film transistor may be ion implanted simultaneously. Similarly a single layer of polysilicon may be deposited and patterned to form the top electrode 66 of the capacitor 60, the gate electrode 56 of the MOSFET 50 and the gate electrode 46 of the thin film transistor 40. Similarly the gate and capacitor dielectrics may be formed in the same process step.

Conventional conductive contacts 68, 58 and 48 are provided to electrodes of the capacitor and the source, drain and gate electrodes of the transistors respectively.

Thus the integrated circuit 10 includes semiconductor devices formed in both the semiconductor filled trench regions 14 and 16 and in the substrate region 15 between the trench regions. Thus isolated, recessed trench regions 22 and 24 of polysilicon material are provided in the substrate surface, having polished surfaces coplanar with the substrate surface, so that capacitors and thin film transistors may be formed at a level coplanar with conventional MOS transistors and other devices formed in the surrounding substrate surface.

Figure 2:
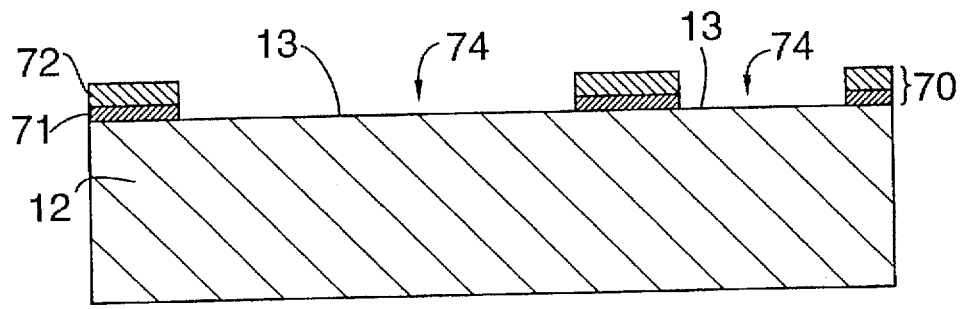
FIGS. 2 to 9 shows schematic cross-sectional views, on a smaller scale, of part of the integrated circuit structure according to the first embodiment, as shown in FIG. 1, at successive stages during fabrication.
Figure 3:
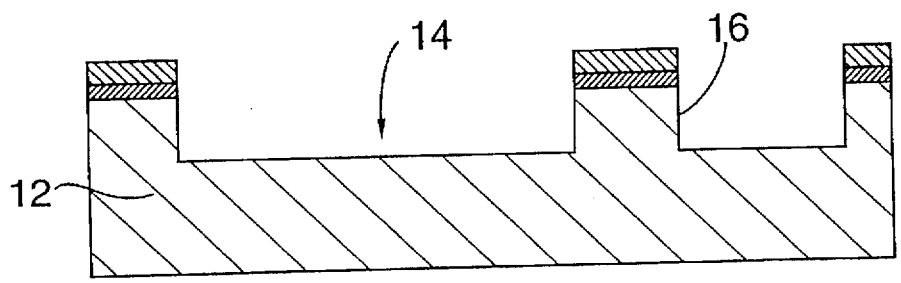
Figure 4:
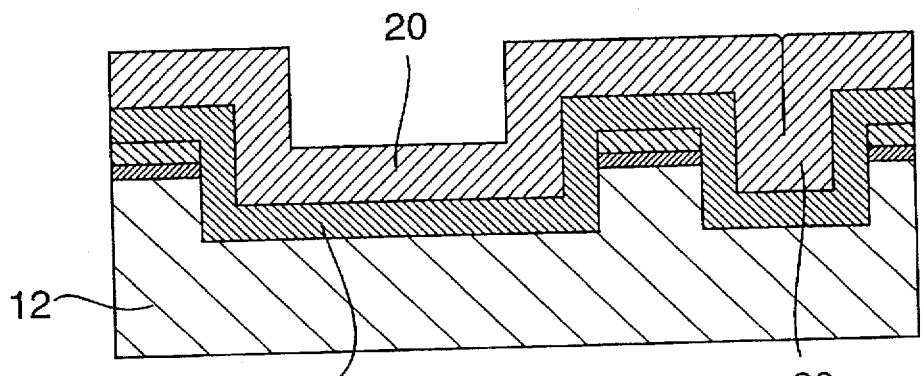

Successive steps in a method of forming part of an integrated circuit structure 10 according to the first embodiment of the invention is shown schematically in FIGS. 2 to 9. A silicon substrate wafer 12 is provided with an etch masking layer 70, which is deposited on the substrate and patterned to define openings 74 exposing selected regions of the surface 13 of the substrate, for etching steep-sided trenches 14 and 16 into the substrate. The etch masking layer may comprise a single layer, or preferably, as shown in FIG. 2, comprises a first layer of a chemical mechanical polish resistant material 71 and an overlying oxide layer 72, for reasons to be explained below. The steep-sided trenches 14 and 16 (FIG. 3) are etched by any suitable known method of anisotropic etching. The layer 72 acts as an etch mask during the trench etch in the silicon substrate. A conformal layer of a dielectric material 18, e.g. silicon dioxide formed by a known method of chemical vapour deposition, is deposited overall and extends conformally into each trench and over the masking layer 70 covering the substrate surface FIG. 4. The conformal dielectric layer 18 lines each trench. The trenches are 6hen filled with a conformal layer 20 of a semiconductor material deposited over the dielectric layer 18. The layer of semiconductor material 20 is sufficiently thick to fill the trenches, at least level with the substrate surface 13, or as shown in FIG. 4, level with the surface of the masking layer 72.

The semiconductor layer 20 is selected to provide an appropriate substrate material for devices to be formed therein, and may comprise doped or undoped polycrystalline silicon or amorphous silicon. Doped semiconductors may be provided by a suitable known method, e.g. ion implantation. and annealing, or by chemical vapour deposition (CVD) with in situ doping. Where doping is by ion implantation, annealing must be carried out for a sufficient time and at a temperature sufficient to ensure dopant activation and full grain growth. If required, a thin deposited oxide layer may be provided on the surface of the semiconductor layer during annealing to prevent autodoping.

Figure 5:
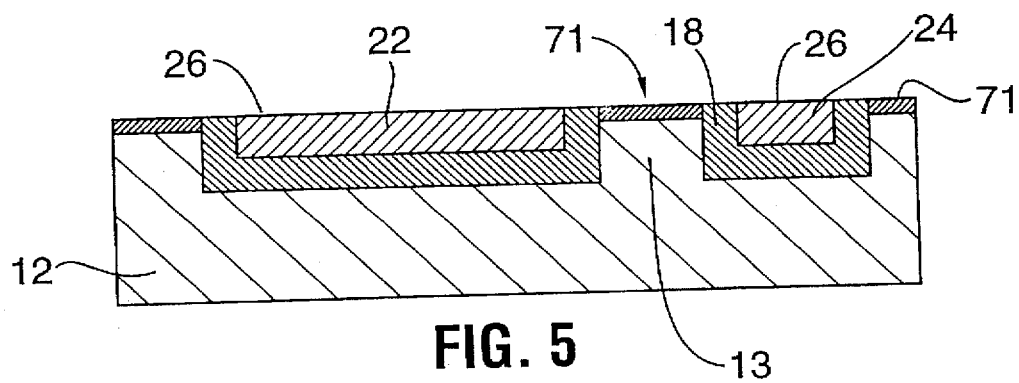

The resulting structure is then fully planarized to provide a structure as shown in FIG. 5, by removal of each of the layers extending above the polish resistant layer 71 on the substrate surface (i.e. parts of semiconductor material 20, parts of the dielectric layer 18, and the oxide layer 72, which formed the trench etch mask). Advantageously, planarization is accomplished by a step of chemical mechanical polishing, in one or more stages, to provide fully planarized semiconductor regions 22 and 24 in the trenches 16 and 18, respectively. Each semiconductor filled trench region thus has a planarized, polished surface 24 that is level with the polish resistant layer 71, and thus nearly coplanar with the substrate surface 26 (FIG. 5).

The masking layer 70 preferably comprises a thin layer 71 of a relatively hard, CMP resistant material, such as silicon nitride, and an overlying layer 72 of silicon dioxide. The latter forms an etch mask during etching of the trenches in the silicon substrate, and may be removed, conveniently, during the CMP process. The relatively hard layer 71 forms a polish stop layer during the chemical mechanical polishing step. The polish resistant layer 71 may be selectively removed from the substrate surface after the CMP step, e.g. by a conventional known selective nitride etch, to expose the surface of regions 13 of the semiconductor well region of the substrate, for formation of devices, e.g. transistors. The small discontinuity in the surface which exists after removal of the polish stop layer 71 may be reduced, e.g. by continuing CMP step for a short time after the polish stop is reached, thereby removing part of the polish stop layer and thus reducing its thickness, before selectively removing layer 71 from the substrate. However, the polish stop layer is typically relatively thin, ~200 Å, and the surface topography is nevertheless effectively fully planarized.

Thus there is provided a planarized substrate comprising trench isolated, recessed regions of polysilicon having planar surfaces defined in a coplanar surface of the substrate, on which semiconductor devices may be formed, e.g. capacitors or transistors, as shown in FIG. 1.

Figure 6:
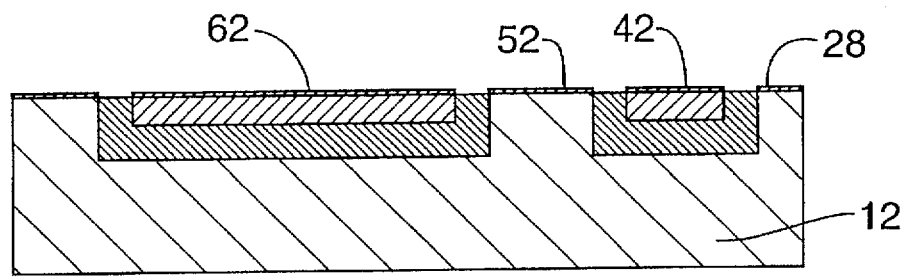

After removal of the polish stop layer 71, a layer of dielectric, i.e. $SiO_2$, is provided on the exposed semiconductor surfaces, i.e. the surface of the semiconductor substrate 15 and polysilicon trench regions 22 and 24, either by oxidation of the surface, or by deposition thereon of a surface layer of deposited oxide (FIG. 6). The resulting oxide regions form respectively, a capacitor dielectric 62 of capacitor 60, a gate dielectric 42 of thin film transistors 40, and a gate dielectric 52 of MOSFET 50 respectively (FIG. 6).

Figure 7:
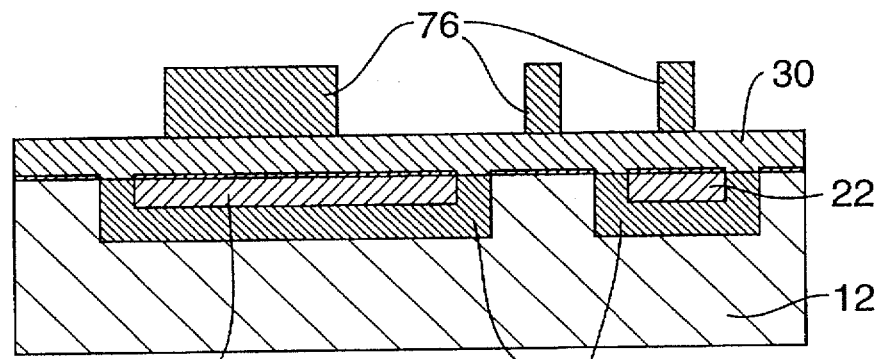
Figure 8:
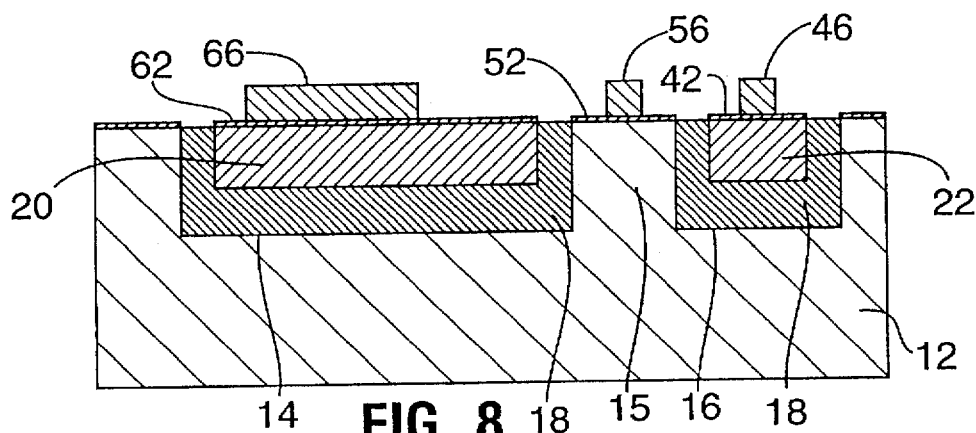
Figure 9:
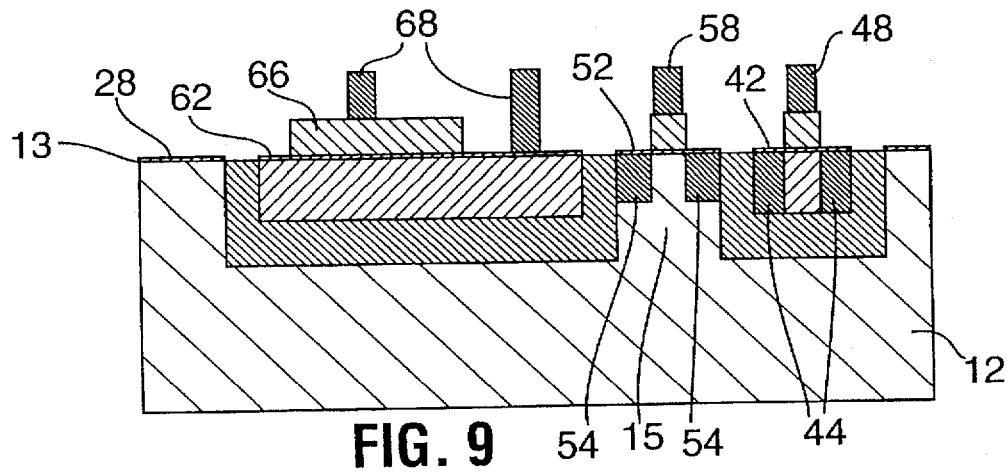
Figure 10:
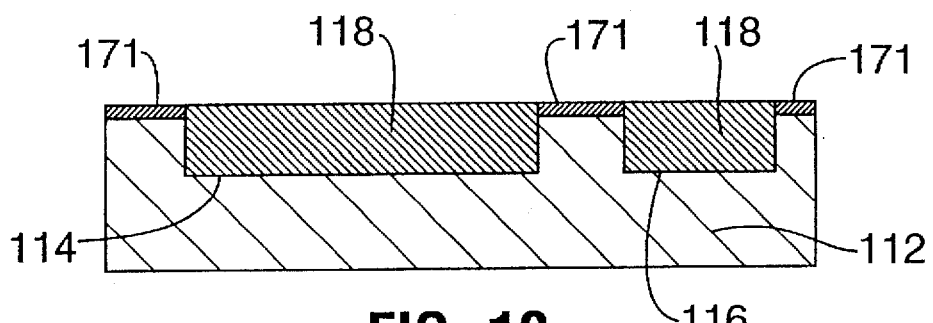
FIGS. 10 to 13 shows schematic cross-sectional views through a part of an integrated circuit structure at successive stages during fabrication of an integrated circuit structure according to a second embodiment of the present invention.
Figure 11:
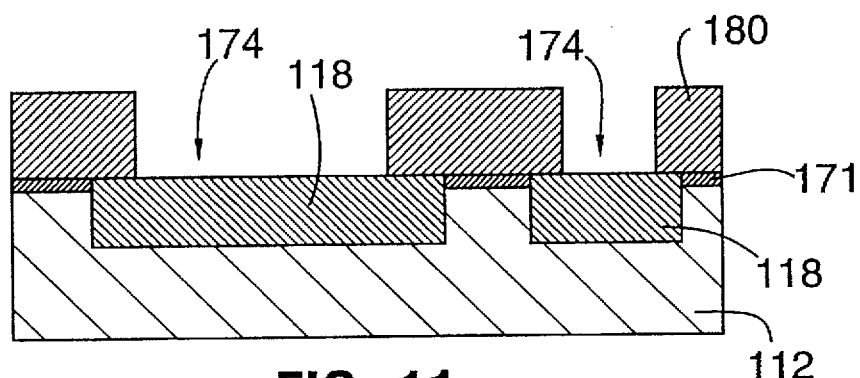

Subsequently, a conductive layer 30, i.e. a heavily doped layer of polysilicon, is deposited overall (FIG. 7). The polysilicon layer is patterned, e.g. by coating with photoresist 76, patterning, and selectively etching to define a top capacitor electrode 66 of the capacitor 60, a gate electrode 56 of the MOS transistor 50 and a gate electrode 46 of the thin film transistor 40 respectively (FIG. 8).

Source and drain regions 54 of the MOSFET, and source and drain regions 44 of the thin film transistor are defined by ion implantation.

Conductive contacts 68 are provided to top and bottom electrodes of the capacitor 60 in a conventional manner. Similarly, contacts are provided to the source, drain and gate electrodes of the MOSFET and thin film transistors, by a conventional method, to provide the structure of FIG. 9 (gate contacts 48 and 58 only are shown). This structure is also shown enlarged as FIG. 1.

It is particularly advantageous that a substrate formed by the method described above provides fully recessed trench isolated semiconductor regions, (e.g. doped or undoped polysilicon, or amorphous silicon) and that the semiconductor region is provided with a smooth, polished surface. Thus the surface of the semiconductor layer is provided with a smooth surface, independent of the method of growth or deposition of the semiconductor layer. This is particularly beneficial when thin films are to be provided thereon, e.g. for capacitor or gate dielectrics. Thin dielectric oxides grown or deposited on the relatively smooth polished surface have improved uniformity, with fewer defects. Improved dielectric quality reduces leakage and breakdown, which is beneficial particularly for thin gate dielectrics and capacitor dielectrics. Consequently the method provides a near zero topography substrate for obtaining smooth polysilicon regions suitable for formation of various semiconductor device structures at the same level as other devices formed in the surrounding substrate.

Advantageously wide semiconductor filled trenches may be successfully etched without dishing by use of a method as described in more detail in the inventors' above-mentioned copending U.S. patent application Ser. No. 08/080,544, filed 24 Jun., 1993, entitled "Method of Making Integrated Circuits", by providing a polish stop in a center region of the trench, which is coplanar with the polish resistant layer on the surface of the substrate. In this way, fully planarized trenches 6 mm wide or more may be formed with insignificant dishing.

Alternative polish resistant layers include silicon carbide, boron nitride. Where other materials are used for the substrate and trench filling layers, depending on factors such as the relative hardness of the material filling the trenches and the substrate surface layer and the CMP slurry composition and chemistry, a polish resistant layer may be unnecessary.

After the CMP step the etch stop may be left in place if regions of the semiconductor substrate surface are not required for formation of devices. Alternatively the nitride polish resistant layer may be selectively removed to expose the substrate regions in between the trench isolated polysilicon substrate regions. The nitride polish stop layer is typically in the range ~200–1200 Å. It has been found that used of a thicker polish stop layer, ~1200 Å, is advantageous to allow for some non-uniformity across the wafer surface during polishing. Nevertheless, the polish stop layer is thin relative to the depth of the trenches, so even after removal, surface is effectively fully planarized for subsequent processing. The latter discontinuity may be reduced further if the CMP polishing step proceeds so as to remove part of the polish stop layer before selective removal of the semiconductor layers. Thus there is provided a method of forming an isolated, fully recessed polysilicon substrate, which has a smooth surface, independent of the method of deposition of polysilicon, the deposited material impurity content, and subsequent thermal cycles.

A polysilicon substrate as described above can readily be integrated with MOS and Bipolar fabrication processes for formation of capacitors, resistors, thin-film transistors and interconnection lines as will be described below. The thickness of the polysilicon substrate can be made independent of the polysilicon deposition process, i.e. by providing trenches of different width and depth, with properties of the semiconductor region defined by trench geometry.

This method has the advantage of decoupling the preparation of the polysilicon substrate from the rest of the process. Thus isolated polysilicon substrate regions can be fabricated early in the process, when thermal budget constraints are not as stringent. (i.e. before formation of shallow junctions, or low melting point metallization).

Subsequently, after formation of the planar substrate with isolated polysilicon regions, dielectrics (e.g. a poly oxide or a TFT gate oxide), TFT gate electrodes, gigaohm resistor shields, capacitor top electrodes or resistor shields can be formed by deposition and patterning, simultaneously or otherwise, using conventional methods known in the industry.

An application of this method includes formation of bipolar and MOS integrated circuit devices.

Figure 12:
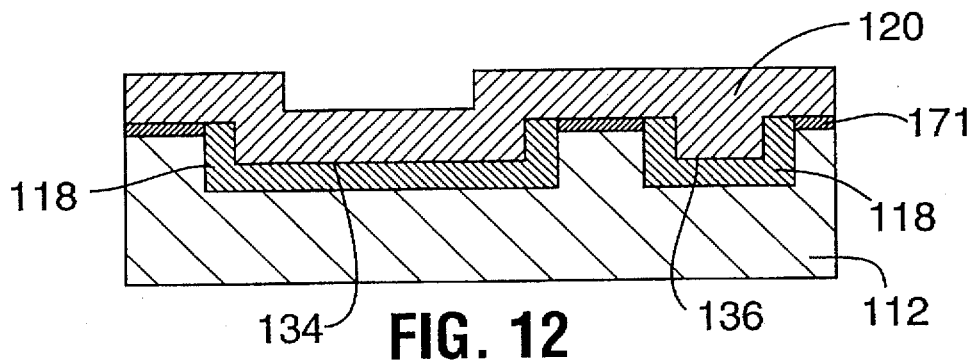
Figure 13:
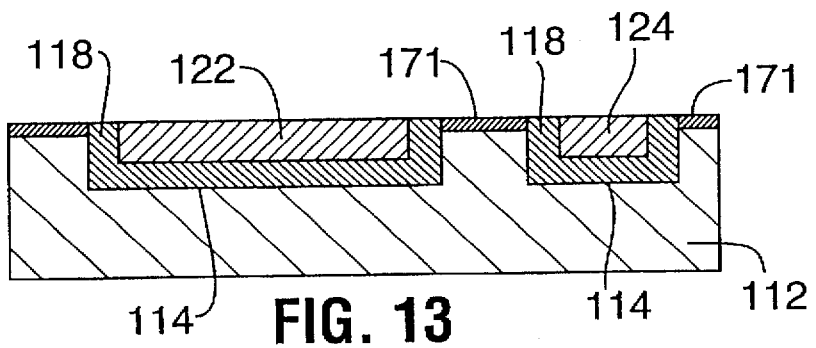
Figure 14:
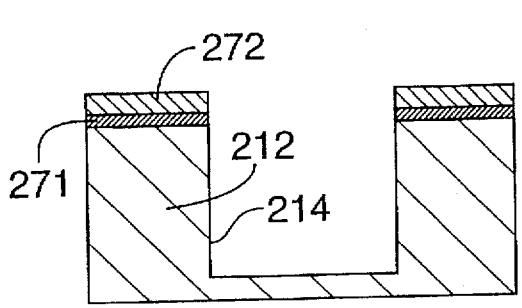
FIGS. 14 to 19 show schematic cross-sectional views through a part of an integrated circuit structure at successive stages during fabrication of a shielded interconnect structure according to the third embodiment of the present invention.
Figure 15:
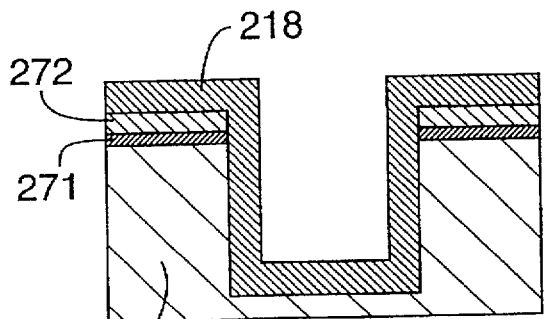

Schematic cross-sectional views through a part of an integrated circuit structure at successive stages during fabrication of an integrated circuit substrate according to a second embodiment of the present invention are shown in FIGS. 10 to 13. A semiconductor Substrate 112 in the form of a semiconductor silicon wafer is provided having steep-sided trenches 114 and 116 defined therein, similar to that in the first embodiment. A surface layer 171 of a polish resistant material is provided, as described in the first embodiment. However subsequent steps differ in that, after the trenches 114 and 116 are completely filled with a layer of dielectric 118, i.e. SiO2 or other suitable dielectric, part of the dielectric layer 118 is then removed by a step chemical mechanical polishing to provide a surface level with the polish resistant layer 171 on the substrate surface. Subsequently, a coating of photoresist 180 is provided on the surface and patterned to define openings 174 for etching trenches 134 and 136 in the dielectric layer 118, by a conventional known anisotropic etch method. After stripping the photoresist, a conformal layer 120 of semiconductor material, i.e. polysilicon, is then provided overall. FIG. 12. The substrate is planarized by CMP to provided fully planarized polysilicon regions 122 and 124 recessed in substrate within the trenches 114 and 116 respectively, similar to the structure of the first embodiment shown in FIG. 5. If required the polish stop layer 171 is removed, and the resulting substrate may be used to form semiconductor device structures in subsequent method steps, similar to those described in the first embodiment.

The substrates described in the first and second embodiments are examples having shallow trenches, i.e. low aspect ratio trenches. Other embodiments provide structures based on deep trenches.

Figure 16:
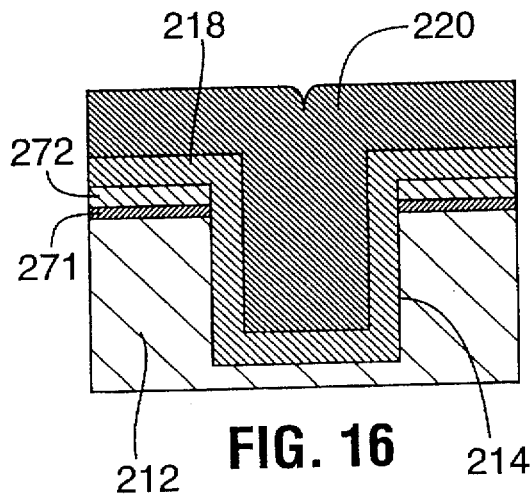
Figure 17:
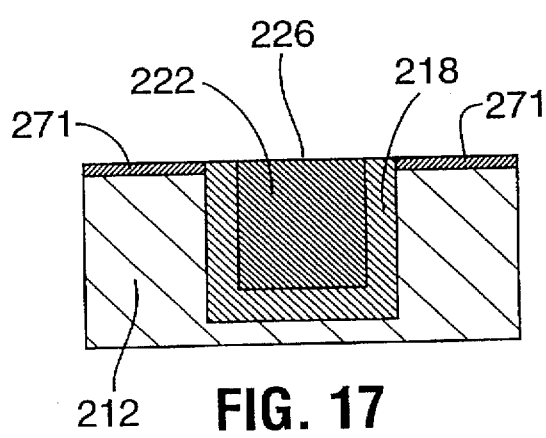
Figure 18:
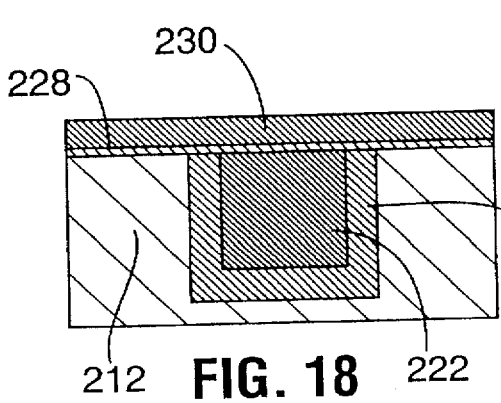
Figure 19:
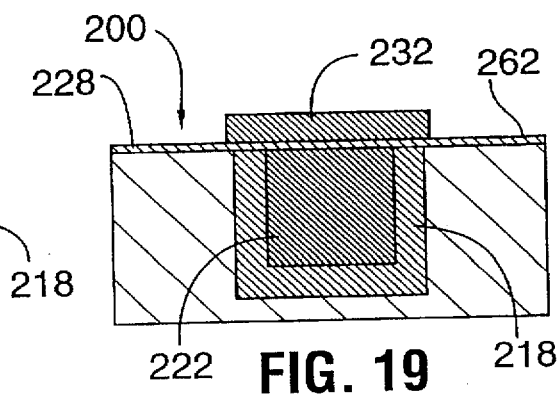
Figure 20:
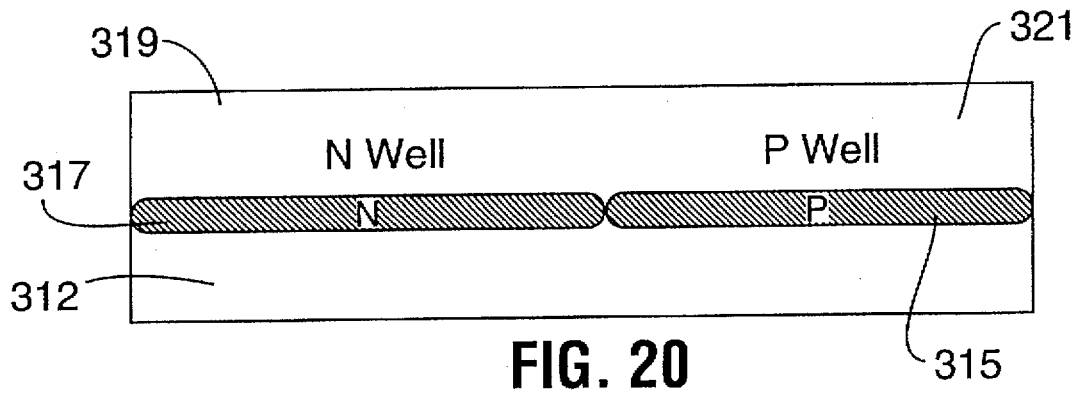
FIGS. 20 to 27 show schematic cross-sectional views through a part of an integrated circuit structure at successive stages during fabrication of an integrated circuit structure according to the fourth embodiment of the present invention.
Figure 21:
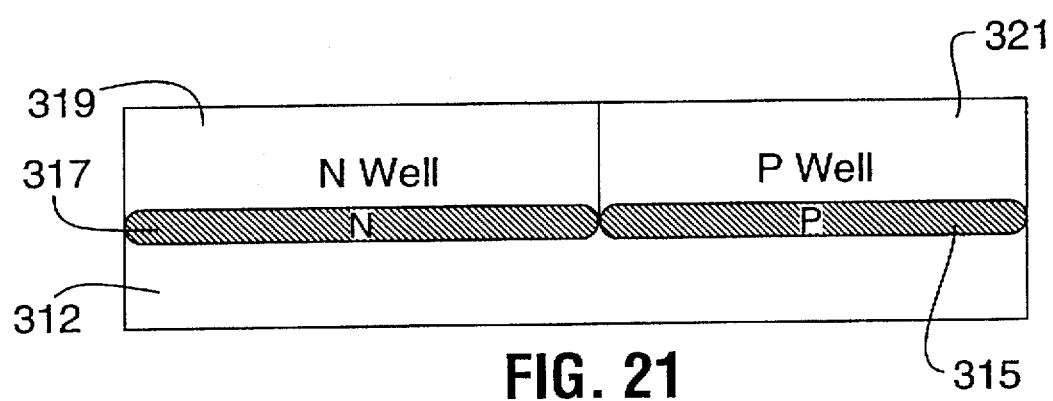

For example, in a method of forming a vertical trench isolated, shielded resistor 200 according to a third embodiment of the present invention (FIGS. 14 to 19) a semiconductor substrate 212 is provided, and after masking with a polish stop layer 271 and an etch masking layer 272, similar to the first embodiment, a deep, steep-sided trench 214 is anisotropically etched in the semiconductor substrate surface. The trench 214 is lined with a conformal layer of dielectric 218. The trench is then filled with a conformally deposited layer of a semiconductor material 220, i.e. polysilicon of sufficient thickness to fill the trench as shown in FIG. 16. The polysilicon is appropriately doped to provide the required resistivity. The polysilicon layer is then etched back by CMP to provide a fully planarized region 222 of polysilicon in the trench, having a surface 226 coplanar with a surface of the polish stop layer 271 on the substrate surface (FIG. 17). A thin dielectric layer 228 is deposited on the planarized surface and another conductive layer of polysilicon 230 is deposited overall (FIG. 18). The latter is patterned to define a shield electrode 223 of the resistor structure 200 shown in FIG. 19. End contact regions of the resistor are appropriately doped and contacts are provided in a conventional manner (not shown).

Thus a novel process technique is provided for forming isolated, fully planarized regions of smooth polycrystalline silicon recessed in a semiconductor substrate, in either shallow or deep trench regions. The polysilicon regions are isolated and embedded in the substrate, and formed at an early stage of the process. The structure provides for formation of different device structures comprising polysilicon elements at a level coplanar with other device structures formed in the surrounding substrate. The resulting structure has near zero topography.

An example of integrating several different device structures (options) into a BiCMOS process flow is as follows:

1. Provide a standard semiconductor silicon substrate as starting material.
2. Form buried layer and epitaxial layers (FIG. AA)
3. Form device well regions (FIG. BB)
4. Form isolation for device wells, i.e. shallow trench formation (FIG. CC)
5. Prepare polycrystalline silicon substrate for formation of options with zero topography (FIG. DD) including selective doping where required and anneal prior to CMP planarization):
   a) resistors
   b) capacitors
   c) gigaohm resistors
   d) thin film transistor
   e) interconnect (shielded)
   Structures may be placed in either an N well or P well as required.
6. Trench etch for fully shielded resistor structure
7. Oxide deposition, poly deposition, doping as required, anneal and CMP planarization
8. Dielectric formation (i.e. gate oxide, simultaneously or otherwise).
9. Deposition of a conductive layer for shield/gate/top capacitor plate formation The integrated circuit is then completed using standard or conventional known processing to complete the remainder of the BiCMOS process, i.e.

10. Bipolar device formation (formation of base/emitter)
11. Source/drain formation by implantation/ diffusion, and
12. Interconnection.

Interconnects structures and metallization may be provided by known, suitable conventional methods.

FIGS. 20 to 27 show schematic cross-sectional views through a part of an integrated circuit structure at successive stages during fabrication of an integrated circuit structure 300 according to the fourth embodiment of the present invention.

Figure 27:
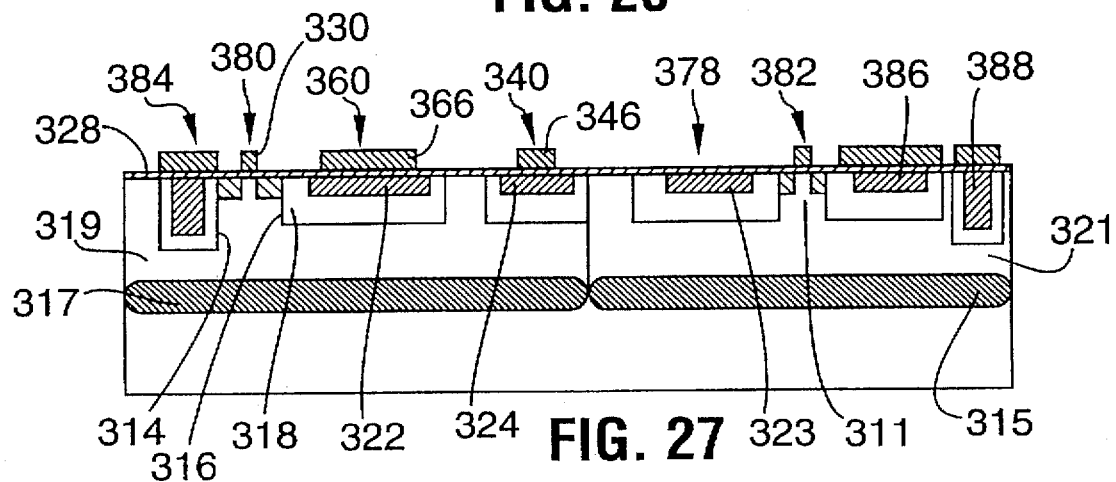

To form the partially completed integrated circuit structure shown schematically in FIG. 27, deep and shallow trench regions are provided by two separate etching steps. Elements of individual device structures may be formed in separate steps, or preferably, where possible processing is designed to integrate a plurality of different device structures with a minimum of process steps.

Figure 22:
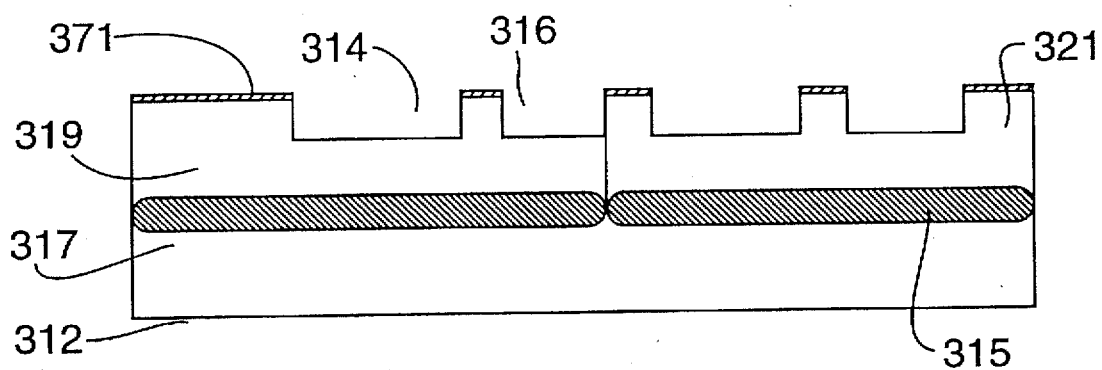
Figure 23:
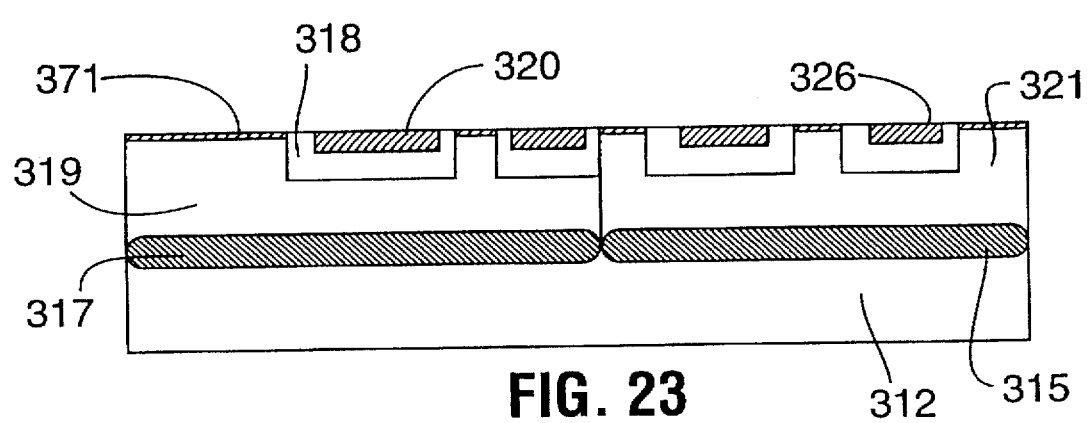

A semiconductor substrate 312 is provided having buried heavily doped n and p type buried layers 317 and 315 overlying epitaxial layers of semiconductors 319 and 321 appropriately doped to form N-well and P-well regions. An etch masking layer comprising single or multiple layers, including a polish stop layer is deposited on the surface and patterned, and the substrate is etched anisotropically to define steep-sided trench regions 314, 315, 316 and 317 therein. The trench regions 314 and 316 have steep sides, and are relatively wide, having a low aspect ratio (FIG. 22).

A conformal layer of an dielectric material 318 is deposited overall to line the bottom and sidewalls of the trenches, e.g. as described in the other embodiments. Then a layer of semiconductor material 320 is deposited overall, filling the trenches, at least level with the substrate surface. All parts of layers 318 and 320 extending above the surface of the polish stop layer 371 are then removed by chemical mechanical polishing to leave a fully planarized surfaces 326 of semiconductor filled regions 322, 323, 324, and 325 in trenches 314, 315, 316 and 317 respectively, each having surfaces coplanar with the polish stop layer 371.

Figure 24:
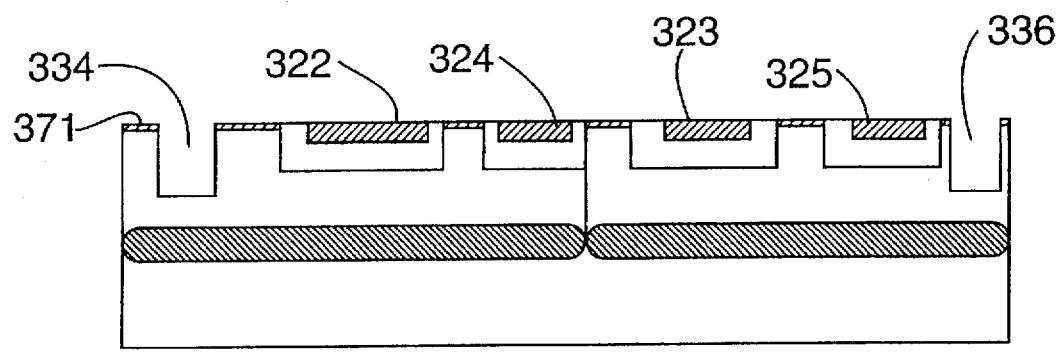
Figure 25:
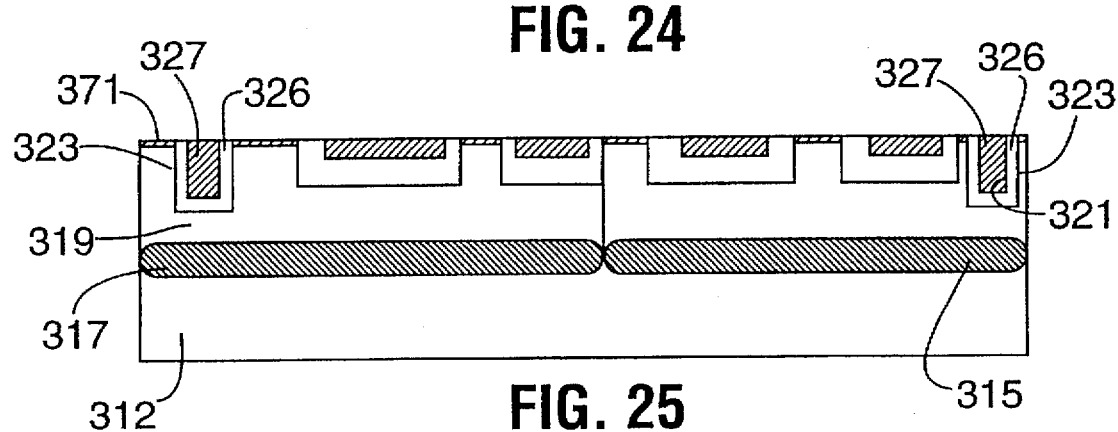
Figure 26:
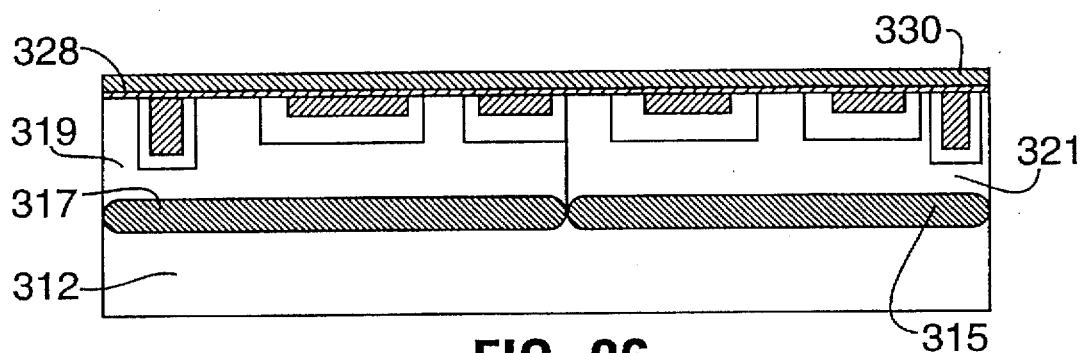

The surface is then selectively masked to defining regions for forming deep trenches and deep trenches 334 and 336 are anisotropically etched, and filled with layers of dielectric 326 and conductive 327 material as required, in a similar manner as described above for formation of the resistor the third embodiment. After another CMP step to fully planarized the resulting substrate, a plurality of trench isolated semiconductor regions are provided in the substrate surface as shown in FIG. 24. After removing the polish stop layer 371, a dielectric layer 328 is deposited overall, parts of which form gate and capacitor dielectrics for each device. A conductive layer 330, e.g. a layer of doped polysilicon is then deposited overall and patterned to defined parts of each device structure, e.g. transistor gates 346 and capacitor top electrode 366, as shown in FIG. 27. FIG. 27 shows a plurality of different devices formed on the same substrate, i.e. a capacitor 360, a resistor 378, a P channel MOSFET 380 and an N channel MOSFET 382, a thin film transistor or high value resistor 340, a vertical trench isolated resistor 384 and shielded interconnect conductors 386 and 388 in shallow and deep (vertical configuration) trench structures respectively. These structures would typically be options, some or all of which may be included in a particular integrated circuit. These structures are all shown together on a single substrate region for exemplary purposes to illustrate how common layers of conductive or dielectric material may be used for parts of more than one type of device.

Considering the capacitor structure 360, the recessed trench isolated polysilicon layer 322 is doped to provide a conductive layer which forms the bottom electrode of a flat plate capacitor. A capacitor dielectric layer is provided thereon by part of layer 328 of silicon dioxide, which is formed by a conventional method, i.e. by oxidation of the bottom electrode or by deposition of a layer of dielectric e.g. an oxide or other suitable material. Alternatively, a combination of process steps may be used to form, for example, a multilayer stacked dielectric. A fully planarized, smooth surface prepared by chemical mechanical polishing of the bottom polysilicon electrode forms an excellent surface for formation thereon of a good quality capacitor dielectric. An overlying top electrode is then provided by a second conductive layer, i.e. part of another doped polysilicon layer 366 deposited over the dielectric 328. Contacts to the top and bottom electrode (not shown) are formed in a conventional manner in subsequent process steps.

In another region of the IC substrate, part of the recessed first polysilicon layer 324 forms the resistive body of a resistor 378. The first polysilicon layer 323 within the trench region is selectively doped to form a relatively high resistivity resistive body and end portions are more heavily doped to form conductive contact regions. The resistor is shielded within the substrate, and a thin dielectric oxide isolates the resistive body. In yet another region, part of a recessed polysilicon region 324 forms the substrate for a thin film transistor with parts of the layer 324 selectively doped to form source and drain regions of the transistor. Part of the overlying thin dielectric layer 328 forms a gate dielectric, and part of the second layer of polysilicon form the gate electrode 346 of the thin film transistor. Conductive contacts are provided in a conventional manner in subsequent process steps. For example, a thin film transistor this type may be designed so as to function as a shielded gate, high value (gigaohm) resistor as described in U.S. Pat. No. 0,5,296,726. to T. W. MacElwee and entitled "High Value Resistive Load for an Integrated Circuit".

In other regions of the substrate wafer between trenches 314 to 316, a P channel MOS FET 380 is provided; similarly, a N channel MOS FET 382 is provided in the P well. These MOSFETs have source and drain regions defined in doped regions of the semiconductor substrate in a conventional manner. Gate electrodes are formed by appropriately doped parts of second conductive polysilicon layer 330, with part of the thin dielectric layer 328 forming a gate dielectric underlying the gate electrode.

Thus individual trench isolated and recessed regions of polysilicon form parts semiconductor devices comprising capacitors, resistors, thin film transistors, and interconnect conductors. Parts of a single overlying thin dielectric provide gate dielectric and capacitor dielectric structures. An overlying second conductive layer provides other elements e.g. top electrodes of capacitors, gate electrodes of the devices.

Other trench regions define in the substrate, (not shown) may be filled with dielectric and/or semiconductor material to form deep or shallow trench isolation regions between individual devices or between well regions, as is known in the industry.

This method has application in formation of various semiconductor devices and electrical devices in an embedded, and isolated, polysilicon substrate region. The resulting smooth surface of the polysilicon regions is particularly advantageous for formation of high quality capacitor dielectrics for flat plate capacitors.

The isolated polysilicon regions are fully planarized with a smooth surface. The planarized substrate topography allows for various optional elements, such as, linear capacitors, TFTs, shielded poly resistors to be provided with much reduced topography compared with known processes in which these optional structures are formed on the surface of field isolation regions. Thus a substrate having a smoother surface reduces topography related, lithographic and etching problems.

In particular, the process described above allows for a large variety of options to be easily integrated without increasing the surface topography.

Further, polysilicon layers are deposited early in the overall process flow to allow for integration of a shield layer to protect sensitive device surfaces from a various source of radiation, e.g. during plasma processing or ion implantation.

Thus the method improves manufacturability of deep submicron structures without increasing process complexity and with consequent improvements in yield.

While the embodiments described above use silicon substrates and polysilicon trench regions, clearly, the process may be adapted for semiconductor materials other than silicon and polysilicon.

What is claimed is:

1. A method of fabrication of an integrated circuit structure comprising:

providing an integrated circuit substrate having a planar surface and a plurality of steep-sided trenches defined therein;

filling the trenches with at least one trench filling layer comprising a semiconductor material selected from the group consisting polycrystalline and amorphous semiconductor materials;

planarizing the substrate surface by a step of chemical mechanical polishing to remove parts of the at least one trench filling layer extending above a surface of the substrate, thereby forming a plurality of trench regions filled with semiconductor material and each having a fully planarized surface substantially coplanar with the substrate surface;

and then forming semiconductor devices in the semiconductor substrate and in the semiconductor filled trench regions.

2. A method according to claim 1 wherein the step of filling the trenches with at least one trench filling layer comprising a semiconductor material comprises lining the trench with a layer of dielectric material and then filling the trench with a layer of semiconductor material.

3. A method according to claim 1 wherein the step of filling the trenches with at least one trench filling layer comprising a semiconductor material comprises:

depositing a conformal layer of dielectric in each trench and then filling each trench with a conformal layer of semiconductor material.

4. A method of fabrication of an integrated circuit structure comprising:

providing an integrated circuit substrate having a planar surface and a plurality of steep-sided trenches defined therein;

filling the trenches by steps comprising:

lining the trenches with a layer of dielectric and then filling the trenches with at least one trench filling layer comprising a semiconductor material;

planarizing the substrate surface by a step of chemical mechanical polishing to remove parts of the at least one trench filling layer and layer of dielectric extending above a surface of the substrate, thereby forming a plurality of trench regions filled with semiconductor material and each having a fully planarized surface substantially coplanar with the substrate surface;

and then forming semiconductor devices in the semiconductor substrate and in the semiconductor filled trench regions;

wherein the step of filling the trenches with at least one trench filling layer comprising a semiconductor material comprises filling the trench with a semiconductor material selected from the group consisting polycrystalline silicon or amorphous silicon.

5. A method of fabrication of an integrated circuit structure comprising:

providing an integrated circuit substrate having a planar surface and a plurality of steep-sided trenches defined therein;

filling the trenches by steps comprising:

lining the trenches with a layer of dielectric and then filling the trenches with at least one trench filling layer comprising a semiconductor material;

planarizing the substrate surface by a step of chemical mechanical polishing to remove parts of the at least one trench filling layer and layer of dielectric extending above a surface of the substrate, thereby forming a plurality of trench regions filled with semiconductor material and each having a fully planarized surface substantially coplanar with the substrate surface;

and then forming semiconductor devices in the semiconductor substrate and in the semiconductor filled trench regions;

wherein the substrate is provided having a chemical mechanical polish resistant layer.

6. A method of fabrication of an integrated circuit structure comprising:

providing an integrated circuit substrate having a planar surface and a plurality of steep-sided trenches defined therein;

filling the trenches by steps comprising:

lining the trenches with a layer of dielectric and then filling the trenches with at least one trench filling layer comprising a semiconductor material;

planarizing the substrate surface by a step of chemical mechanical polishing to remove parts of the at least one trench filling layer and layer of dielectric extending above a surface of the substrate, thereby forming a plurality of trench regions filled with semiconductor material and each having a fully planarized surface substantially coplanar with the substrate surface;

and then forming semiconductor devices in the semiconductor substrate and in the semiconductor filled trench regions;

wherein the step of lining the trenches with a layer of dielectric comprises depositing a conformal layer of dielectric in each trench.

7. A method according to claim 4 wherein the polycrystalline silicon is deposited by chemical vapour deposition with in situ doping.

8. A method according to claim 4 wherein the polycrystalline silicon is deposited by chemical vapour deposition and subsequently doped by ion implantation and annealing.

9. A method according to claim 5 wherein providing the trench filling layers comprises providing another polish resistant layer, the polish resistant layer thereby forming a polish stop having a surface coplanar with that of the polish resistant layer of the substrate surface.

* * * * *